United States Patent
Li (10) Patent No.: US 9,584,101 B2
(45) Date of Patent: Feb. 28, 2017

(54) RAPID TRANSITION SCHMITT TRIGGER CIRCUIT

(71) Applicant: SMARTER MICROELECTRONICS (GUANG ZHOU) CO., LTD., Guangzhou (CN)

(72) Inventor: Yang Li, Guangzhou (CN)

(73) Assignee: SMARTED MICROELECTRONICS (GUANG ZHOU) CO., LTD., Guangzhou (CN)

( * ) Notice: Subject to any disclaimer, the term of this patent is extended or adjusted under 35 U.S.C. 154(b) by 10 days.

(21) Appl. No.: 14/739,482

(22) Filed: Jun. 15, 2015

(65) Prior Publication Data

US 2015/0280694 A1 Oct. 1, 2015

Related U.S. Application Data

(63) Continuation of application No. PCT/CN2013/086263, filed on Oct. 30, 2013.

(30) Foreign Application Priority Data

Dec. 17, 2012 (CN) .......................... 2012 1 0554649

(51) Int. Cl.
*H03K 3/00* (2006.01)
*H03K 3/3565* (2006.01)

(52) U.S. Cl.
CPC .................................. *H03K 3/3565* (2013.01)

(58) Field of Classification Search
CPC ................................ H03K 3/00; H03K 3/3565
See application file for complete search history.

(56) References Cited

U.S. PATENT DOCUMENTS 6,441,663 B1 * 8/2002 Chuang ................ H03K 3/3565
327/206
9,306,550 B2 * 4/2016 Kumar ................. H03K 3/3565

FOREIGN PATENT DOCUMENTS

CN 101488736 A 7/2009

* cited by examiner

*Primary Examiner* — Hai L Nguyen
(74) *Attorney, Agent, or Firm* — Syncoda LLC; Feng Ma; Junjie Feng (57) ABSTRACT

A small-sized rapid transition Schmitt trigger circuit for use with a silicon-on-insulator process includes: a first NMOS transistor, a first PMOS transistor, a second NMOS transistor, a second PMOS transistor, and a PMOS/NMOS body control circuit; wherein, the PMOS/NMOS body control circuit is configured to, through changing threshold voltages of the first NMOS transistor and the first PMOS transistor, enable different flip-flop threshold voltages for input transitions from high electrical levels to low electrical levels and from low electrical levels to high electrical levels.

14 Claims, 4 Drawing Sheets

RAPID TRANSITION SCHMITT TRIGGER CIRCUIT

CROSS-REFERENCE TO RELATED APPLICATIONS

The present application is a continuation of, and claims priority to, PCT/CN/2013/086263 filed on Oct. 30, 2013, which claims priority to Chinese Patent Application CN 201210554649.9 filed on Dec. 17, 2012. The disclosures of the above applications are hereby incorporated by reference in their entirety.

BACKGROUND

Schmitt trigger has a wide range of applications in digital and analog circuits, especially in the areas of anti-noise and waveform shaping, Schmitt trigger plays an irreplaceable role. Schmitt trigger exhibits dual flip-flop threshold characteristics in its direct current (DC) characteristics, for different flip-flop direction, the flip-flop threshold is different, specifically, when input signal changes from low electrical level to high electrical level, the flip-flop threshold is V+; when the input signal changes from high electrical level to low electrical level, the flip-flop threshold is V−. When the low electrical level signal inputted by Schmitt trigger has coupling noise, as long as the aggregate value of signal electrical level and noise electrical level does not exceed V+, the output state of the Schmitt trigger will not be changed; when the high electrical level signal inputted by Schmitt trigger has coupling noise, as long as the aggregate value of signal electrical level and noise electrical level is not lower than V−, the output state of the Schmitt trigger will not be changed either.

Figure 1A:
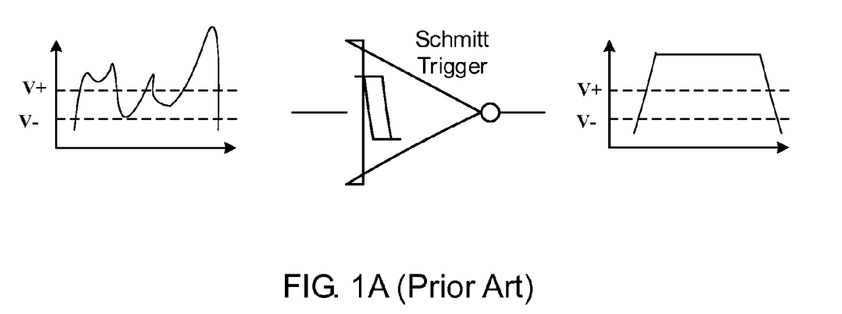
Figure 1B:
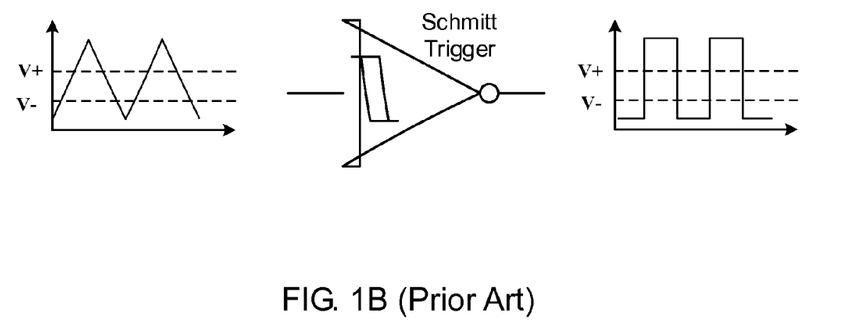
FIG. 1B is a schematic diagram of input waveform and output waveform when the input signal of the Schmitt trigger is triangular wave.

Thus, the filtering of noise signal is achieved, thus, results in the input and output waveforms as shown in FIG. 1A. As shown in FIG. 1B, when the input signal of Schmitt trigger is a triangular wave signal, because of its dual flip-flop threshold characteristics, the output signal becomes a square wave, so to achieve the integration from triangular wave signal to square wave signal. In digital circuits, if the transition between high electrical level and low electrical level of a certain signal is too slow, by using the Schmitt trigger to integrate it, a steep jump can be achieved, thus results in clear digital electrical level signal.

Figure 2:
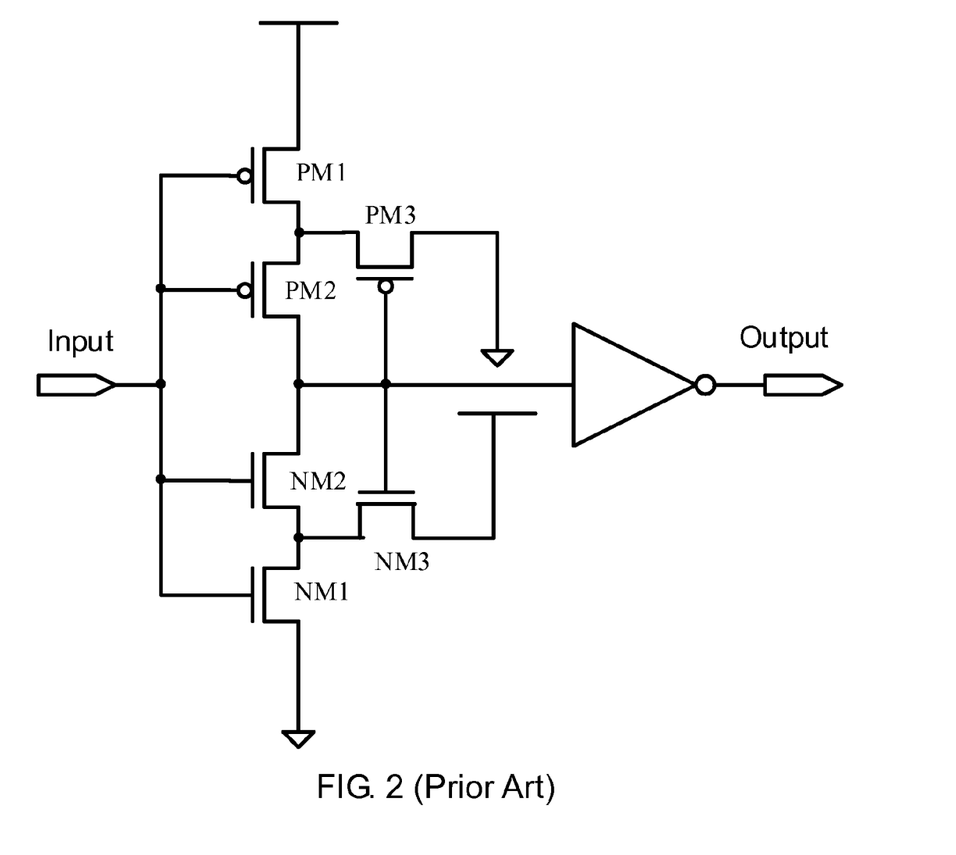
FIG. 2 is structural diagram of a typical conventional Schmitt trigger circuit.

Conventional Schmitt trigger circuit implementation is as shown in FIG. 2, the transition from low electrical level to high electrical level of the electrical level of the input signal will enhance the source voltage of N-type metal oxide semiconductor (NMOS) transistor NM2; the transition from high electrical level to low electrical level of the input level will reduce the source voltage of P-type metal oxide semiconductor (PMOS) transistor PM2, thus achieving the dual flip-flop threshold characteristics. Since the pull-up unit and the pull-down unit each contain two metal oxide semiconductor (MOS) transistors connected in series, it is slower and also takes up more chip area.

SUMMARY

Embodiments of present disclosure provide a small-sized rapid transition Schmitt trigger circuit used for a silicon-on-insulator process comprising: a first NMOS transistor, a first PMOS transistor, a second NMOS transistor, a second PMOS transistor and a PMOS/NMOS body control circuit; wherein, the PMOS/NMOS body control circuit is configured by changing the threshold voltage of the first NMOS transistor and the first PMOS transistor so that there is different flip-flop threshold voltage during the input transition from high electrical level to low electrical level and from low electrical level to high electrical level.

In above-described embodiment, the PMOS/NMOS body control circuit is configured by controlling the voltage of the body region of the first NMOS transistor and the first PMOS transistor to enable different flip-flop threshold voltage during the input transition from high electrical level to low electrical level and from low electrical level to high electrical level.

In above-described embodiment, the gate electrode of the first PMOS transistor is connected to the input end, the source electrode of the first PMOS transistor is connected to the power supply, the drain electrode of the first PMOS transistor is connected to the inter-stage common node; the gate electrode of the second PMOS transistor is connected to the inter-stage common node, the source electrode of the second PMOS transistor is connected to the power supply, the drain electrode of the second PMOS transistor is connected to the output end.

In above-described embodiment, the gate electrode of the first NMOS transistor is connected to the input end, the source electrode of the first NMOS transistor is connected to the ground, the drain electrode of the first NMOS transistor is connected to the inter-stage common node; the gate electrode of the second NMOS transistor is connected to the inter-stage common node, the source gate of the second NMOS transistor is connected to ground, the drain electrode of the second NMOS transistor is connected to the output end.

In above-described embodiment, the PMOS/NMOS body control circuit is configured as follows: when the input of the Schmitt trigger is low electrical level, set body region voltage of the first NMOS transistor to 0, and set the body region voltage of the first PMOS transistor to $V_{D1}$; when the input of the Schmitt trigger is high electrical level, set body region voltage of the first NMOS transistor to $V_{D2}$, and set the body region voltage of the first PMOS transistor to $V_{DD}$; wherein, $V_{DD}$ represents power supply voltage, $V_{D1}$ represents low voltage outputted by the first output end of the PMOS/NMOS body control circuit, said first output end is connected to the body region of the first PMOS transistor; $V_{D2}$ represents high voltage outputted by the second output end of the PMOS/NMOS body control circuit, said second output end is connected to the body region of the first NMOS transistor.

In above-described embodiment, the PMOS/NMOS body control circuit comprises: a third PMOS transistor, a fourth PMOS transistor, a third NMOS transistor, a fourth NMOS transistor, a first diode, a resistor, and a second diode.

In above-described embodiment, the drain electrode of the third PMOS transistor and the source electrode of the fourth PMOS transistor are connected to the body region of the first PMOS; the source electrode of the third transistor and the drain electrode of the fourth NMOS transistor are connected to the body region of the first NMOS, the gate electrode of the third NMOS transistor is connected to the gate electrode of the third NMOS transistor is connected to the gate electrode of the fourth PMOS transistor and the output end; the gate electrode of the fourth NMOS transistor is connected to the gate electrode of the third PMOS transistor; the source electrode of the fourth NMOS transistor is connected to the ground, the source electrode of the third PMOS transistor is connected to the power supply; the cathode of the first diode is connected to the power supply, the anode of the first diode is connected to one end of the resistor and the drain electrode of the fourth PMOS transistor; the anode of the second diode is connected to the ground, the cathode of the second diode is connected to the other end of the resistor and the drain electrode of the third NMOS transistor.

Comparing with typical conventional Schmitt trigger circuit, advantages of the Schmitt trigger circuit of various embodiments of the present disclosure may include one or more of the following: because of the existence of the PMOS/NMOS body control circuit, when pulling-up the inter-stage common node, the voltage of the body region of the first PMOS transistor decreases, when pulling-down the inter-stage common node C, the voltage of the body region of the first NMOS transistor raises, due to the body effect of the MOS transistor, reducing the rise time and fall time of the Schmitt trigger; in addition, the pull-up unit only comprises second PMOS transistor, the pull-down unit only comprises second NMOS transistor, therefore, the Schmitt trigger circuit of the embodiments of the present disclosure can have the advantages of a faster flip-flop or transition, and smaller size.

BRIEF DESCRIPTION OF THE DRAWINGS

FIG. 1 A is a schematic diagram of input waveform and output waveform when there is coupling noise from the input signal of Schmitt trigger;

DETAILED DESCRIPTION

Embodiments of the present disclosure is described by specific examples as follows. Those skilled in the art can easily understand other advantages and effects of the present disclosure disclosed by this specification. The present disclosure can also be implemented or applied through other different specific embodiments. The details of this specification can be modified or changed in different ways without departing from the spirit of the disclosure base on different perspectives and applications.

Figure 3:
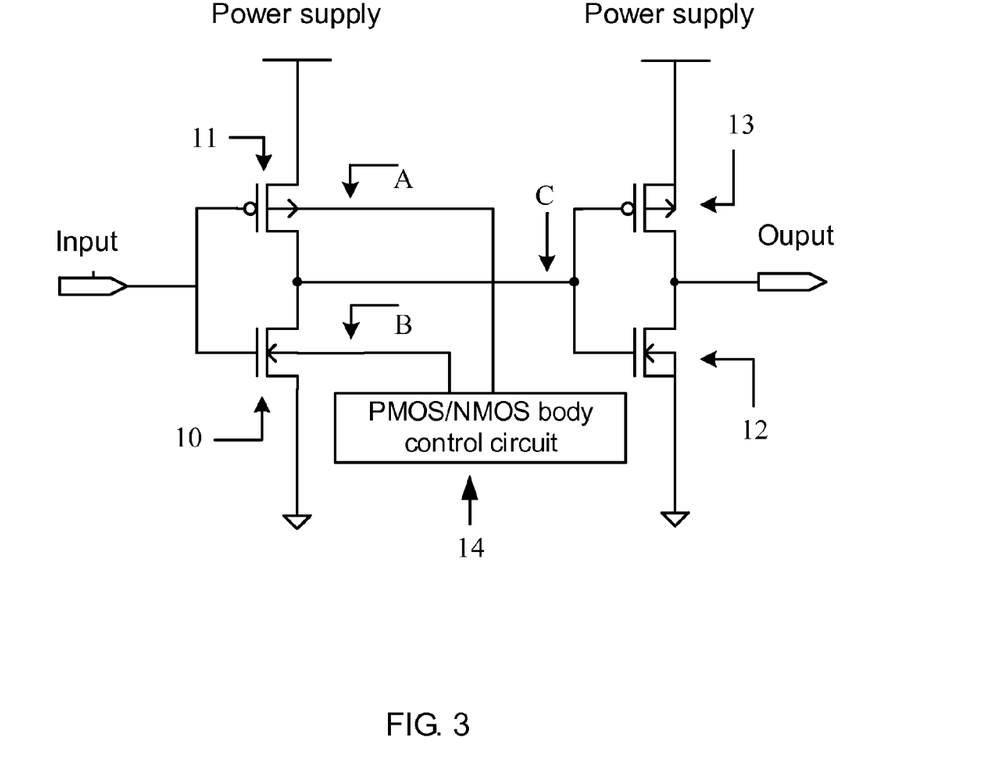
FIG. 3 is a structural diagram of the Schmitt trigger circuit according to some embodiments of the present disclosure.

As shown in FIG. 3, the Schmitt trigger circuit of the embodiments of present disclosure comprises: a first NMOS transistor 10, a first PMOS transistor 11, a second NMOS transistor 12, a second PMOS transistor 13 and a PMOS/NMOS body control circuit 14; wherein, PMOS/NMOS boy control circuit 14, by changing the threshold voltage of the first NMOS transistor 10 and the first PMOS transistor 11, enable different flip-flop threshold voltage for the input transitions from high electrical level to low electrical level and from the low electrical level to the high electrical level, thus achieving the Schmitt trigger function.

Specifically, through controlling the voltage of the body regions of the first NMOS transistor 10 and the first PMOS transistor 11, the PMOS/NMOS body control circuit 14 can change the threshold voltage of the first NMOS transistor 10 and the first PMOS transistor 11, enable different flip-flop threshold voltage of the input transitions from high electrical level to low electrical level and the input transition from low electrical level to high electrical level, thus achieving the Schmitt trigger function.

Connection relationship of various components of the circuit as shown in FIG. 3 is as follows:

The gate electrode of the first PMOS transistor 11 is connected to the input end, the source electrode of the first PMOS transistor 11 is connected to the power supply, the drain electrode of the first PMOS transistor 11 is connected to the inter-stage common node, the body region of the first PMOS transistor 11 is connected to the node A; the gate electrode of the second PMOS transistor is connected to the inter-stage common node C, the source gate of the second PMOS transistor 13 is connected to the power supply, the drain electrode of the second PMOS transistor 13 is connected to the output end, the body region of the first PMOS transistor 10 is connected to node B; the gate electrode of the first NMOS transistor 10 is connected to the input end, the source electrode of the first NMOS transistor 10 is connected to the ground, the drain electrode of the first NMOS transistor 10 is connected to the inter-stage common node C; the gate electrode of the second NMOS transistor 12 is connected to the inter-stage common node C, the source gate of the second NMOS transistor 12 is connected to the ground, the drain gate of the second NMOS transistor 12 is connected to the output end; the voltage of the body region of the first PMOS transistor 11 and the voltages of the body region of the first NMOS transistor 10 are controlled by the PMOS/NMOS body control circuit 14. Here, the body region of the first PMOS transistor 11 refers to the separate substrate of the first PMOS transistor 11, the body region of the first NMOS transistor 10 refers to the separate substrate of the first NMOS transistor 10.

Pull-up unit comprises: a second PMOS transistor 13; the pull-down unit comprises: a second NMOS transistor 12.

The working principle of Schmitt trigger circuit shown in FIG. 3 is as follows: The threshold voltage of the transistor is $V_T$, when the source body voltage $V_{SB} \neq 0$, then, $$V_T = V_{T0} + \gamma(\sqrt{|2\phi_F| + |V_{SB}|} - \sqrt{|2\phi_F|});$$

$$\gamma = \frac{\sqrt{2q\varepsilon_{Si}N_{Sub}}}{C_{ox}};$$

wherein, $\gamma$ is body threshold factor, $V_{T0}$ is the threshold voltage of the transistor when $V_{SB}=0$, for NMOS transistor, $V_{T0}$ is $V_{Tn0}$, for PMOS transistor, its $V_{T0}$ is $V_{Tp0}$, $\phi_F$ is the Fermi potential of the semiconductor material of the substrate; $\varepsilon_{Si}$ is dielectric constant of Si; $N_{Sub}$ is the doping concentration of the semiconductor material of the substrate; $C_{ox}$ is the gate oxide capacitance per unit area. When voltage of the body region of the transistor changes, the threshold voltage of the transistor will also change. In SOI process, using full dielectric isolation, each device of the circuit is fabricated in silicon island. Compared with the bulk silicon transistor using a common substrate or well region, SOI can easily control the voltage of the body region of the transistor.

The functionalities of the PMOS/NMOS body control circuit 14 may include: when the input signal of the input end is low electrical level signal, set the value of the voltage of the body region of the first NMOS transistor, e.g., the voltage of node B to 0, at the same time, when pulling down the voltage of the body region of the first PMOS transistor 11, i.e., the voltage of node A $V_p$ to $V_{D1}$, when the input signal of the input end is high electrical level signal, pull up the voltage of the body region of the first NMOS transistor 10, i.e., the voltage of node B from $V_n$ to $V_{D2}$, at the same time, set the voltage of the body region of the first PMOS transistor, i.e., the voltage of node A to $V_{DD}$; wherein, $V_p$ represents the voltage of the body region of the first PMOS transistor 11, $V_{DD}$ represents the voltage of the power supply, $V_n$ represents the voltage of the body region of the first NMOS transistor 10, $V_{D1}$ represents low voltage outputted by the first output end of the PMOS/NMOS body control circuit, said first output end is connected to the body region of first PMOS transistor, i.e., said first output end is connected to node B; $V_{D2}$ represents high voltage outputted by the second output end of PMOS/NMOS body control circuit, said second output end is connected to the body region of the first NMOS transistor, i.e., said second output end is connected to node A.

If the input signal is a low electrical level signal, the voltage if inter-stage common node C is $V_{DD}$, at this moment, the voltage of the body region of the first NMOS transistor, i.e. the voltage of node B, is 0, the threshold voltage of the first NMOS transistor 10 is still $V_{Tn0}$; the PMOS/NMOS body control circuit 14 pull the voltage of the body region of the first PMOS transistor 11, i.e., the voltage of node A, down to $V_{D1}$, the threshold voltage of the first PMOS transistor 11 becomes $V_{Tp}$; in this case, the flip-flop threshold voltage of the Schmitt trigger circuit is:

$$V+ = \frac{V_{DD} - |V_{Tp}| + \beta V_{Tn0}}{\beta + 1};$$

$$\beta = \sqrt{\frac{W_n/L_n}{W_p/L_p}};$$

wherein, β represents the constant related to the first PMOS transistor 11 and the first NMOS transistor 10, $W_n$ represents the channel width of the first NMOS transistor 10, and $L_n$ represents the channel length of the first NMOS transistor 10, $W_p$ represents the channel width of the first PMOS transistor 11, $L_p$ represents the channel length of the first PMOS transistor 11.

If the input signal is a high-level signal, the voltage of the inter-stage common node C is 0, at this moment, the voltage of the body region of the first PMOS transistor 11, i.e., the voltage of the node A is $V_{DD}$, the threshold voltage of the first PMOS transistor 11 is still $V_{Tp0}$.

PMOS/NMOS body control circuit 14 pulls up the voltage of the body region of the first NMOS transistor 10 to $V_{D2}$, the threshold voltage of the first NMOS transistor is changed to $V_{Tn}$; in this case, the flip-flop threshold voltage of the Schmitt trigger circuit is:

$$V- = \frac{V_{DD} - |V_{Tp0}| + \beta V_{Tn}}{\beta + 1};$$

$$\beta = \sqrt{\frac{W_n/L_n}{W_p/L_p}}.$$

Thus, the electrical level of the input signal of the Schmitt trigger circuit changes from high electrical level to low electrical level, the flip-flop threshold voltage is V+, when the electrical level of the input signal changes from low electrical level to high electrical level, the flip-flop threshold voltage is V−, the anti-interference range of the Schmitt trigger circuit illustrated in FIG. 3 is:

$$(V+) - (V-) = \frac{(|V_{Tp0}| - |V_{Tp}|) + \beta(V_{Tn0} - V_{Tn})}{\beta + 1};$$

$$\beta = \sqrt{\frac{W_n/L_n}{W_p/L_p}}.$$

Figure 4:
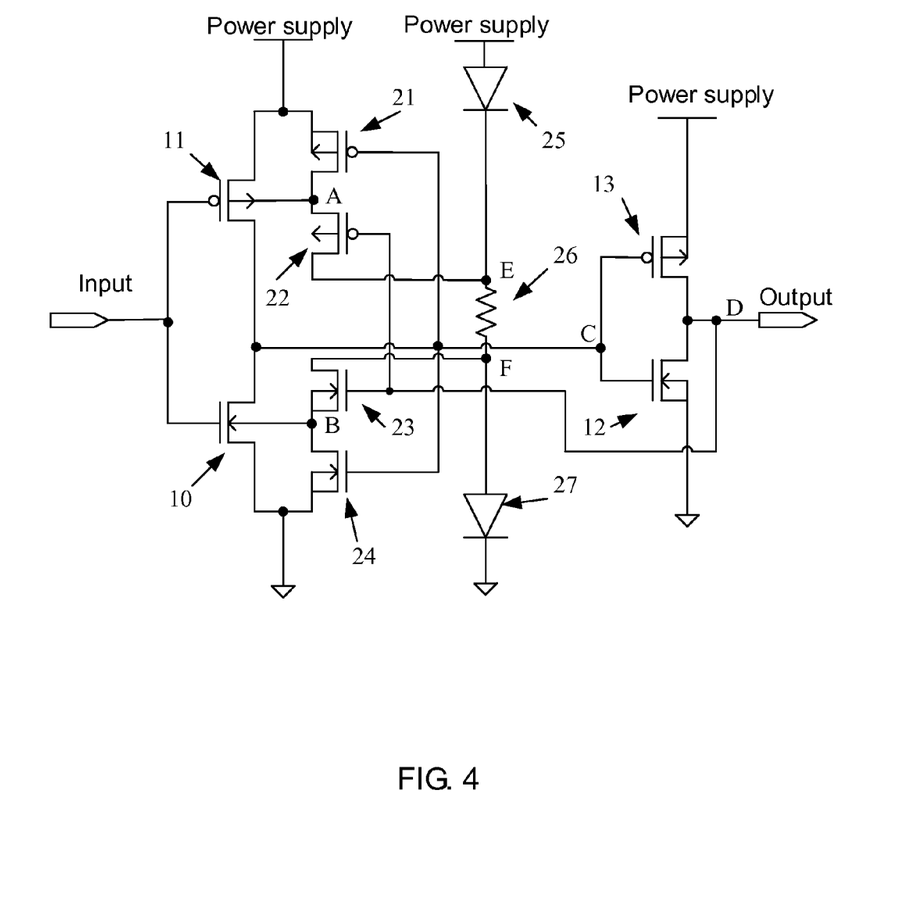
FIG. 4 is a schematic view of a Schmitt trigger circuit according to some embodiments of the present disclosure.

FIG. 4 is an embodiment of the Schmitt trigger circuit of the present disclosure. As shown in FIG. 4, the circuit comprises: a first NMOS transistor 10, a first PMOS transistor 11, a second NMOS transistor 12, a second PMOS transistor 13, a third PMOS transistor 21, a fourth PMOS transistor 22, a third NMOS transistor 23, a fourth NMOS transistor 24, a first diode 25, a resistor 26, and a second diode 27; wherein, the PMOS/NMOS body control circuit 14 comprises: a third PMOS transistor 21, a fourth PMOS transistor 22, a third NMOS transistor 23, a fourth NMOS transistor 24, a first diode 25, a resistor 26, and a second diode 27.

Connection relationship of components of the Schmitt trigger circuit is shown in FIG. 4:

The gate electrode of the first PMOS transistor 11 is connected to the input end, the source electrode of the first PMOS transistor 11 is connected to the power supply, the drain electrode of the first PMOS transistor is connected to the inter-stage common node C 11, the body region of the first PMOS transistor 11 is connected to the node A; the gate electrode of the second PMOS transistor 13 is connected to the inter-stage common node C, the source electrode of the second PMOS transistor 13 is connected to the power supply, the drain electrode of the second PMOS transistor 13 is connected to the output end; the gate electrode of the first NMOS transistor 10 is connected to the input end, the source electrode of the first NMOS transistor 10 is connected to the ground, the drain electrode of the first NMOS transistor 10 is connected to the inter-stage common node C, the body region of the first NMOS transistor is connected to the node B; the gate electrode of the second NMOS transistor is connected to the inter-stage common node C, the source electrode of the second NMOS transistor 12 is connected to the ground, the drain electrode of the second NMOS transistor is connected to the output end; the drain electrode of the third PMOS transistor 21 and the source electrode of the fourth PMOS transistor 22 is connected to the node A;

The drain electrode of the fourth NMOS transistor and the source electrode of the third NMOS transistor are connected to the node B; the gate electrode of the third NMOS transistor is connected to the gate electrode of the fourth PMOS transistor and the output end; the gate electrode of the fourth NMOS transistor 24 is connected to the gate electrode of the third PMOS transistor 21; the source electrode of the fourth NMOS transistor is connected to the ground, the source electrode of the third PMOS transistor 21 is connected to the power supply; the cathode of the first diode 25 is connected to the power supply, the anode of the first diode 25 is connected to one end of the resister 26 and the drain electrode of the fourth PMOS transistor; the anode of the second diode 27 is connected to the ground, the cathode of the second diode is connected to the other end of the resistor 26 and the drain gate of the third NMOS transistor. In this embodiment, the first diode 25 and the second diode 27 is identical, of course, in practical applications, the first diode 25 and the second diode 27 may not be identical.

In the following descriptions, the connection point formed by the anode of the first diode 25, one end of the resistor 26 and the drain electrode of the fourth PMOS transistor 22 is called node E, the connection point formed by the cathode of the second diode 27, the other end of the resistor 26 and the drain electrode of the third NMOS transistor 23 is called node F, the node of the output end is called the node D.

The working principle of Schmitt trigger circuit shown in FIG. 4 is as follows:

The voltage of node E is $V_{DD}-V_D$, the electrical level of node F is $V_D$, wherein, $V_D$ represents the dead-zone voltage of one of diode of the first diode 25 and the second diode 27. When the input signal is low electrical level signal, the voltage of the inter-stage common node C is the power supply voltage $V_{DD}$, the voltage of node D is 0, at this moment, the third PMOS transistor 21 is turned off, the fourth PMOS transistor 22 is turned on, the third NMOS transistor 23 is turned off, the fourth NMOS transistor 24 is turned on; at this moment, the voltage of the body region of the first PMOS transistor 11, i.e., the voltage of node A, equals the voltage of node E, i.e., equals to $V_{DD}-V_D$, voltage of the body region of the first NMOS transistor 10, i.e., the voltage of node B, is equal to 0, thus a higher flip-flop threshold voltage V+ can be obtained. When the input signal is a high electrical level signal, the voltage of the inter-stage common node C is 0, the voltage of node D is the voltage of the power supply $V_{DD}$. At this moment, the third PMOS transistor 21 is turned on, the fourth PMOS transistor 22 is turned off, the third NMOS transistor 23 is turned on, the fourth NMOS transistor 24 is turned off; at this moment, the voltage of the body region of the first PMOS transistor 11, i.e., the voltage of node A, is equal to the voltage of the power supply $V_{DD}$, the voltage of the body region of the first NMOS transistor 10, i.e., the voltage of node B, is equal to the voltage of node F, i.e., $V_D$, thus a lower flip-flop threshold voltage V− can be obtained, and thus the function of dual threshold Schmitt trigger has been achieved.

As can be seen from FIG. 4, through controlling the voltage of the body region of the first NMOS transistor 10 and the first PMOS transistor 11, the PMOS/NMOS body control circuit changes the threshold voltage of the first NMOS transistor 10 and the first PMOS transistor 11, thus enable the different flip-flop threshold voltage for the input transition from high electrical level to low electrical level and from how electrical level to high electrical level.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A small-sized rapid transition Schmitt trigger circuit for use with a silicon-on-insulator process, comprising: a first NMOS transistor, a first PMOS transistor, a second NMOS transistor, a second PMOS transistor, and a PMOS/NMOS body control circuit; wherein, the PMOS/NMOS body control circuit comprises a plurality transistors connected such that, through turning on and off the plurality of transistors thereby changing threshold voltages of the first NMOS transistor and the first PMOS transistor, enables different flip-flop threshold voltages for input transitions from high electrical levels to low electrical levels and from low electrical levels to high electrical levels;
   wherein the PMOS/NMOS body control circuit is further configured to, through controlling voltages of body regions of the first NMOS transistor and the first PMOS transistor, enable the different flip-flop threshold voltages for the input transitions from high electrical levels to low electrical levels and from low electrical levels to high electrical levels; and
   wherein the PMOS/NMOS body control circuit is further configured to: if an input of the Schmitt trigger circuit is at a low electrical level, set a voltage of the body region of the first NMOS transistor to 0, and set a voltage of the body region of the first PMOS transistor to $V_{D1}$; if the input of the Schmitt trigger circuit is at a high electrical level, set the voltage of the body region of the first NMOS transistor to $V_{D2}$, and set the voltage of the body region of the first PMOS transistor to $V_{DD}$; wherein, $V_{DD}$ represents a power supply voltage, $V_{D1}$ represents a low voltage outputted by a first output end of the PMOS/NMOS body control circuit, said first output end is connected to the body region of the first PMOS transistor; $V_{D2}$ represents a high voltage outputted by a second output end of the PMOS/NMOS transistor body control circuit, said second output end is connected to the body region of the first NMOS transistor.

2. The circuit of claim 1, wherein a gate electrode of the first PMOS transistor is connected to an input end, a source electrode of the first PMOS transistor is connected to a power supply, a drain electrode of the first PMOS transistor is connected to an inter-stage common node; a gate electrode of the second PMOS transistor is connected to the inter-stage common node, the source electrode of the second transistor is connected to the power supply, the drain electrode of the second PMOS transistor is connected to an output end.

3. The circuit of claim 2, wherein a gate electrode of the first NMOS transistor is connected to the input end, a source electrode of the first NMOS transistor is connected to a ground, a drain electrode of the first NMOS transistor is connected to the inter-stage common node; a gate electrode of the second NMOS transistor is connected to the inter-stage common node, a source electrode of the second NMOS transistor is connected to the ground, a drain electrode of the second NMOS transistor is connected to the output end.

4. The circuit of claim 1, wherein said PMOS/NMOS body control circuit comprises: a third PMOS transistor, a fourth PMOS transistor, a third NMOS transistor, a fourth NMOS transistor, a first diode, a resistor, and a second diode.

5. The circuit of claim 4, wherein, a drain electrode of the third PMOS transistor and a source electrode of the fourth PMOS transistor are connected to the body region of the first PMOS transistor; a drain electrode of the fourth NMOS and a source electrode of the third NMOS transistor are connected to the body region of the first NMOS transistor; a gate electrode of the third NMOS transistor is connected to a gate electrode of the fourth PMOS transistor and an output end; a gate electrode of the fourth NMOS transistor is connected to a gate electrode of the third PMOS transistor; a source electrode of the fourth NMOS transistor is connected to the ground, a source electrode of the third PMOS transistor is connected to the power supply; a cathode of the first diode is connected to the power supply, an anode of the first diode is connected to one end of the resistor and a drain electrode of the fourth PMOS transistor; an anode of the second diode is connected to the ground, a cathode of the second diode is connected to another end of the resistor and a drain electrode of the third NMOS transistor.

6. An silicon-on-insulator-based integrated circuit comprising one or more waveform shaping circuits including a rapid transition Schmitt trigger circuit, the Schmitt trigger circuit including: a first NMOS transistor, a first PMOS transistor, a second NMOS transistor, a second PMOS transistor, and a PMOS/NMOS body control circuit; wherein, the PMOS/NMOS body control circuit comprises a plurality transistors connected such that, through turning on and off the plurality of transistors thereby changing threshold voltages of the first NMOS transistor and the first PMOS transistor, enables different flip-flop threshold voltages for input transitions from high electrical levels to low electrical levels and from low electrical levels to high electrical levels;
  wherein the PMOS/NMOS body control circuit is further configured to, through controlling voltages of body regions of the first NMOS transistor and the first PMOS transistor, enable the different flip-flop threshold voltages for the input transitions from high electrical levels to low electrical levels and from low electrical levels to high electrical levels; and
  wherein the PMOS/NMOS body control circuit is further configured to: if an input of the Schmitt trigger circuit is at a low electrical level, set a voltage of the body region of the first NMOS transistor to 0, and set a voltage of the body region of the first PMOS transistor to $V_{D1}$; if the input of the Schmitt trigger circuit is at a high electrical level, set the voltage of the body region of the first NMOS transistor to $V_{D2}$, and set the voltage of the body region of the first PMOS transistor to $V_{DD}$; wherein, $V_{DD}$ represents a power supply voltage, $V_{D1}$ represents a low voltage outputted by a first output end of the PMOS/NMOS body control circuit, said first output end is connected to the body region of the first PMOS transistor; $V_{D2}$ represents a high voltage outputted by a second output end of the PMOS/NMOS transistor body control circuit, said second output end is connected to the body region of the first NMOS transistor.

7. The integrated circuit of claim 6, wherein a gate electrode of the first PMOS transistor is connected to an input end, a source electrode of the first PMOS transistor is connected to a power supply, a drain electrode of the first PMOS transistor is connected to an inter-stage common node; a gate electrode of the second PMOS transistor is connected to the inter-stage common node, the source electrode of the second transistor is connected to the power supply, a drain electrode of the second PMOS transistor is connected to an output end.

8. The integrated circuit of claim 7, wherein, a gate electrode of the first NMOS transistor is connected to the input end, a source electrode of the first NMOS transistor is connected to the ground, a drain electrode of the first NMOS transistor is connected to the inter-stage common node; a gate electrode of the second NMOS transistor is connected to the inter-stage common node, a source electrode of the second NMOS transistor is connected to the ground, a drain electrode of the second NMOS transistor is connected to the output end.

9. The integrated circuit of claim 6, wherein said PMOS/NMOS body control circuit comprises: a third PMOS transistor, a fourth PMOS transistor, a third NMOS transistor, a fourth NMOS transistor, a first diode, a resistor and a second diode.

10. The integrated circuit of claim 9, wherein a drain electrode of the third PMOS transistor and a source electrode of the fourth PMOS transistor are connected to a body region of the first PMOS transistor; a drain electrode of the fourth NMOS and a source electrode of the third NMOS transistor are connected to a body region of the first NMOS transistor; a gate electrode of the third NMOS transistor is connected to the gate electrode of the fourth PMOS transistor and an output end; a gate electrode of the fourth NMOS transistor is connected to a gate electrode of the third PMOS transistor; a source electrode of the fourth PMOS transistor is connected to the ground, a source electrode of the third PMOS transistor is connected to the power supply; a cathode of the first diode is connected to the power supply, an anode of the first diode is connected to one end of the resistor and a drain electrode of the fourth PMOS transistor; an anode of the second diode is connected to the ground, a cathode of the second diode is connected to another end of the resistor and a drain electrode of the third NMOS transistor.

11. A method of realizing, in a silicon-on-insulator-based integrated circuit, a rapid transition with a Schmitt trigger circuit, wherein the Schmitt trigger circuit includes: a first NMOS transistor, a first PMOS transistor, a second NMOS transistor, a second PMOS transistor, and a PMOS/NMOS body control circuit comprising a plurality of inter-connected transistors electrically coupled with the first NMOS transistor and the first PMOS transistor; the method comprising: configuring the PMOS/NMOS body control circuit to, through turning on and off the plurality of transistors thereby changing threshold voltages of the first NMOS transistor and the first PMOS transistor, enable different flip-flop threshold voltages for input transitions from high electrical levels to low electrical levels and from low electrical levels to high electrical levels;
  wherein the PMOS/NMOS body control circuit is further configured to, through controlling voltages of body regions of the first NMOS transistor and the first PMOS transistor, enable the different flip-flop threshold voltages for the input transitions from high electrical levels to low electrical levels and from low electrical levels to high electrical levels; and
  wherein the PMOS/NMOS body control circuit is further configured to: if an input of the Schmitt trigger circuit is at a low electrical level, set a voltage of the body region of the first NMOS transistor to 0, and set a voltage of the body region of the first PMOS transistor to $V_{D1}$; if the input of the Schmitt trigger circuit is at a high electrical level, set the voltage of the body region of the first NMOS transistor to $V_{D2}$, and set the voltage of the body region of the first PMOS transistor to $V_{DD}$; wherein, $V_{DD}$ represents a power supply voltage, $V_{D1}$ represents a low voltage outputted by a first output end of the PMOS/NMOS body control circuit, said first output end is connected to the body region of the first PMOS transistor; $V_{D2}$ represents a high voltage outputted by a second output end of the PMOS/NMOS transistor body control circuit, said second output end is connected to the body region of the first NMOS transistor.

12. The method of claim 11, wherein a gate electrode of the first PMOS transistor is connected to an input end, a source electrode of the first PMOS transistor is connected to a power supply, a drain electrode of the first PMOS transistor is connected to an inter-stage common node; a gate electrode of the second PMOS transistor is connected to the inter-stage common node, the source electrode of the second transistor is connected to the power supply, the drain electrode of the second PMOS transistor is connected to an output end.

13. The method of claim 12, wherein a gate electrode of the first NMOS transistor is connected to the input end, a source electrode of the first NMOS transistor is connected to the ground, a drain electrode of the first transistor is connected to the inter-stage common node; a gate electrode of the second NMOS transistor is connected to the inter-stage common node, a source electrode of the second NMOS transistor is connected to the ground, a drain electrode of the second NMOS transistor is connected to the output end.

14. The method of claim 11, wherein said PMOS/NMOS body control circuit comprises: a third PMOS transistor, a fourth PMOS transistor, a third NMOS transistor, a fourth NMOS transistor, a first diode, a resistor and a second diode; and wherein a drain electrode of the third PMOS transistor and a source electrode of the fourth PMOS transistor are connected to the body region of the first PMOS transistor; a drain electrode of the fourth NMOS and a source electrode of the third NMOS transistor are connected to the body region of the first NMOS transistor; a gate electrode of the third NMOS transistor is connected to the gate electrode of the fourth PMOS transistor and an output end; a gate electrode of the fourth NMOS transistor is connected to a gate electrode of the third PMOS transistor; a source electrode of the fourth NMOS transistor is connected to the ground, a source electrode of the third PMOS transistor is connected to the power supply; a cathode of the first diode is connected to the power supply, an anode of the first diode is connected to one end of the resistor and a drain electrode of the fourth PMOS transistor; an anode of the second diode is connected to the ground, a cathode of the second diode is connected to another end of the resistor and a drain electrode of the third NMOS transistor.

\* \* \* \* \*